(12) United States Patent
Shin et al.

(10) Patent No.: US 7,531,112 B2
(45) Date of Patent: May 12, 2009

(54) COMPOSITION FOR FORMING DIELECTRIC, CAPACITOR PRODUCED USING COMPOSITION, AND PRINTED CIRCUIT BOARD PROVIDED WITH CAPACITOR

(75) Inventors: Hyo Soon Shin, Seoul (KR); Jin Ho Kim, Daegu (KR); Jeong Joo Kim, Daegu (KR); Min Ji Ko, Kyungki-do (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 613 days.

(21) Appl. No.: 10/875,323

(22) Filed: Jun. 25, 2004

(65) Prior Publication Data

US 2007/0027246 A1    Feb. 1, 2007

(30) Foreign Application Priority Data

May 4, 2004    (KR) ............... 10-2004-0031374

(51) Int. Cl.
*H01B 1/00*    (2006.01)
(52) U.S. Cl. .............. 252/500; 252/62; 252/62.9 R; 252/516; 361/270; 361/304; 361/311; 361/320; 361/762; 428/329; 524/404; 524/575
(58) Field of Classification Search ........... 252/62.9 R, 252/500, 62, 516; 361/323, 234, 762, 311, 361/270, 304, 320; 156/306.9; 428/692, 428/329; 430/58.8; 524/404, 575
See application file for complete search history.

(56) References Cited

U.S. PATENT DOCUMENTS

| | | | | | |
|---|---|---|---|---|---|
| 4,555,745 | A | * | 11/1985 | Westermeir et al. ......... | 361/320 |
| 4,595,515 | A | * | 6/1986 | Wakino et al. ................ | 252/62 |
| 4,726,991 | A | * | 2/1988 | Hyatt et al. ................... | 428/329 |
| 4,891,399 | A | * | 1/1990 | Ohkawa et al. .............. | 523/200 |
| 4,931,852 | A | * | 6/1990 | Brown et al. ................. | 257/786 |

(Continued)

FOREIGN PATENT DOCUMENTS

JP    04-172362    *    6/1922

(Continued)

OTHER PUBLICATIONS

Japanese Patent Office, Office Action mailed Apr. 10, 2007 and English Translation.
Chinese Intellectual Property Office, Office Action mailed Jan. 25, 2008 and English Translation.

*Primary Examiner*—Douglas Mc Ginty
*Assistant Examiner*—Khanh Tuan Nguyen
(74) *Attorney, Agent, or Firm*—Lowe Hauptman Ham & Berner

(57) ABSTRACT

Disclosed is a composition for forming a dielectric, which is applied to an embedded capacitor with a high dielectric constant, a capacitor produced using the composition, and a PCB provided with the capacitor. The composition includes 40 to 99 vol % of thermoplastic or thermosetting resin, and 1 to 60 vol % of semiconductive filler. Alternatively, the composition includes 40 to 95 vol % of thermoplastic or thermosetting resin, and 5 to 60 vol % of semiconductive ferroelectric substance. Furthermore, the present invention provides the capacitor, produced using the composition, and the PCB provided with the capacitor. Therefore, the dielectric, which is produced using the composition including the semiconductive filler or semiconductive ferroelectric substance, is advantageous in that the dielectric constant is high and a dielectric loss is low. The dielectric is usefully applied to produce an embedded capacitor with the high dielectric constant and the PCB provided with the embedded capacitor.

11 Claims, 1 Drawing Sheet

U.S. PATENT DOCUMENTS

| | | | |
|---|---|---|---|
| 5,079,069 A | | 1/1992 | Howard et al. |
| 5,126,915 A | * | 6/1992 | Pepin et al. .................. 361/304 |
| 5,155,655 A | | 10/1992 | Howard et al. |
| 5,161,086 A | | 11/1992 | Howard et al. |
| 5,162,977 A | | 11/1992 | Paurus et al. |
| 5,169,551 A | * | 12/1992 | Tsunooka et al. ....... 252/62.9 R |
| 5,294,374 A | * | 3/1994 | Martinez et al. ............. 252/516 |
| 6,577,492 B2 | * | 6/2003 | O'Bryan, Jr. ................. 361/311 |
| 6,608,760 B2 | * | 8/2003 | Hartman et al. ............. 361/762 |
| 6,616,794 B2 | * | 9/2003 | Hartman et al. .......... 156/306.9 |
| 6,693,793 B2 | | 2/2004 | Kuwako et al. ............. 361/323 |
| 6,721,162 B2 | * | 4/2004 | Weldon et al. ............... 361/234 |
| 6,821,474 B2 | * | 11/2004 | Lauf et al. ................... 264/435 |
| 7,182,929 B1 | * | 2/2007 | Singhal et al. ............ 423/592.1 |
| 2001/0036052 A1 | * | 11/2001 | Hartman et al. ............ 361/270 |
| 2002/0039667 A1 | * | 4/2002 | Takaya et al. ................ 428/692 |
| 2003/0139510 A1 | * | 7/2003 | Sagal et al. .................. 524/404 |
| 2003/0194625 A1 | * | 10/2003 | Tanaka et al. ............... 430/58.8 |
| 2004/0109298 A1 | * | 6/2004 | Hartman et al. ............. 361/762 |
| 2005/0042743 A1 | * | 2/2005 | Kawai et al. .............. 435/287.2 |

FOREIGN PATENT DOCUMENTS

| | | | |
|---|---|---|---|
| JP | 53-086219 | * | 1/1977 |
| JP | 02-050167 | * | 2/1990 |
| JP | 04-145134 A | | 5/1992 |
| JP | 5057851 | | 3/1993 |
| JP | 5057852 | | 3/1993 |
| JP | 05-240298 | * | 9/1993 |
| JP | 7009609 | | 1/1995 |
| JP | 63-164107 A | | 7/1998 |
| JP | 2001-266680 | * | 3/2000 |
| JP | 2002-334612 | | 11/2002 |
| JP | 2004-059702 A | | 2/2004 |
| JP | 2004-59716 A | | 2/2004 |

* cited by examiner

COMPOSITION FOR FORMING DIELECTRIC, CAPACITOR PRODUCED USING COMPOSITION, AND PRINTED CIRCUIT BOARD PROVIDED WITH CAPACITOR

RELATED APPLICATIONS

The present application is based on, and claims priority from, Republic of Korea Application Serial Number 2004-31374, filed May 4, 2004, the disclosure of which is hereby incorporated by reference herein in its entirety.

BACKGROUND OF THE INVENTION

1. Field of the Invention

The present invention relates, in general, to a composition for forming a dielectric, a capacitor produced using the composition, and a printed circuit board provided with the capacitor. More particularly, the present invention pertains to a composition for forming a dielectric, which is applied to an embedded capacitor with a relatively high dielectric constant, a capacitor produced using the composition, and a printed circuit board provided with the capacitor.

2. Description of the Prior Art

Generally, a passive element mounted on a printed circuit board (PCB) is regarded as an obstacle in miniaturizing a laminated substrate and in improving a frequency of the laminated substrate. Additionally, a rapid embedment trend and an increase of an I/O number in the semiconductor field make it difficult for a plurality of passive elements to be positioned around active elements because of insufficient space around the active elements.

Furthermore, the increased working frequency of semiconductors leads to the use of a capacitor for decoupling so as to stably supply power to an input terminal. In this regard, the capacitor cannot reduce inductance caused by high frequencies until the capacitor is positioned as close as possible to the input terminal.

With respect to the recent trend of the miniaturization and increased frequency of the PCB, a process of positioning the passive element, for example the capacitor, under an active chip of the laminated substrate, or a technology of forming a high dielectric layer in the PCB or multi-layered PCB, in which the high dielectric layer is used as the capacitor, is suggested, so as to mount the capacitor at a desired position around an active chip.

Particularly, a method of reducing electrical inductance, in which a dielectric layer is formed as an embedded capacitor under an active chip to enable the active chip to be electrically connected to the embedded capacitor while being positioned as close as possible to an input terminal to maximally reduce a length of a wire, has been developed in the art, as indicated by the Sanmina patents, U.S. Pat. Nos. 5,079,069, 5,155,655, 5,161,086, and 5,162,977.

As such, it is required that the dielectric layer for forming the embedded capacitor has a relatively high dielectric constant and a relatively low dielectric loss. An epoxy-based material, in which powdered ferroelectric substance, such as $BaTiO_3$, is dispersed in a thermoplastic or a thermosetting resin, has been used as a material of the dielectric layer, as disclosed in Japanese Pat. Laid-Open Publication Nos. Hei. 5-57851, 5-57852, and 7-9609.

However, the epoxy-based material, containing the thermoplastic or thermosetting resin and the ferroelectric substance powder mixed with each other, is disadvantageous in that the dielectric constant of the embedded capacitor is a relatively low 6 to 22.5 when the embedded capacitor is produced using the epoxy-based material, and that it is difficult to secure a dielectric constant of about 20 or more, preferably 50 or more by increasing an amount of the ferroelectric substance powder.

Dielectric properties of the epoxy-based material, depending on a volume of the ferroelectric substance powder, such as $BaTiO_3$, in the epoxy-based material may be calculated by the Lichtenecker equation. In this regard, the Lichtenecker equation shows that when substances with different dielectric constants are connected to each other in parallel or in series, the dielectric constants correlate to a volume ratio of the substances. In case that the substances are connected in series, a total dielectric constant of the substances is reduced. On the other hand, when the substances are connected in parallel, the total dielectric constant of the substances is increased.

Practically, the substances with the different dielectric constants are not arranged in series nor in parallel, but in a combined manner of series and parallel arrangements on a complex substrate. Hence, an exponential value of the Lichtenecker equation depends on a mixing ratio and a mixing manner (series arrangement, parallel arrangement, and the extent of the mixing of the series and parallel arrangements) of the different substances as shown in FIG. 1. In FIG. 1, Kd' represents the dielectric constant of a spherical particle (i.e. filler) and Km' represents the dielectric constant of a medium (i.e. resin) when mixing two (2) ingredients.

For example, when the exponential value, n is −1, all of the substances are arranged in series. On the other hand, when the exponential value, n is +1, all of the substances are arranged in parallel. Practically, when a material powder is randomly dispersed, the exponential value of the Lichtenecker equation gets closer to the series arrangement. Accordingly, it is difficult to improve the dielectric constant.

In other words, in case that a composition contains a resin with the very low dielectric constant, such as epoxy acting as a matrix, and ferroelectric substance powder, even though the dielectric constant of the ferroelectric substance powder is improved, the capacitor is produced using the composition containing the resin and ferroelectric substance powder arranged in series. As a consequence, the total dielectric constant of the capacitor is controlled by the value of epoxy having a low dielectric constant.

Meanwhile, the dielectric constant may be increased by increasing a ratio of the volume of the powder to the volume of the resin. Hence, a volume ratio of the ferroelectric substance powder in the composition must be increased in order to produce a composition a relatively high dielectric constant. However, the volume ratio of the ferroelectric substance powder cannot be easily increased because of technical limitations of the process of producing the PCB. For example, when the volume ratio of the ferroelectric substance powder in the composition is increased, a ceramic constituting the PCB becomes brittle, and thus, the productivity of the PCB is reduced. Accordingly, it is difficult to improve the dielectric constant of the composition while ensuring intrinsic flexibility of the epoxy resin.

As well, a method of adding a filler with excellent conductivity, such as metal powder, to a resin has been suggested to improve a dielectric constant of a material. With respect to this, even though an actual interval between electrodes is not reduced by adding the filler to the resin, the same effect as in the case of reducing an interval between capacitors is achieved, and thus an apparent dielectric constant of the material is increased.

However, when the filler (conductor) with excellent conductivity, such as the metal powder, is added to the resin, dielectric breakdown will likely to occur. In detail, when the metal powder is added to the resin in a predetermined amount or more, a percolation phenomenon occurs, and thus, the material does not act as a dielectric, but as a conductor. Therefore, an amount of the conductive filler, such as the metal powder, added to the resin is limited because of the percolation phenomenon.

In addition, when the conductor, such as the metal powder, is added to the resin, the dielectric loss of the material is undesirably increased because of an eddy current of the material, caused by a variation of the frequency of the PCB. With respect to this, a technology for improving a dielectric constant of a material, in which a metal is added to a resin, is disclosed in Japanese Pat. Laid-Open Publication No. 2002-334612.

An effort has been made to avoid the undesirable percolation phenomenon occurring when the metal powder is added to the resin, in which a insulate dielectric layer is coated on the metal powder. However, this technique is problematic in that even though the percolation between metal particles is suppressed and the dielectric constant is improved, the dielectric loss is relatively high.

SUMMARY OF THE INVENTION

Therefore, the present invention has been made keeping in mind the above disadvantages occurring in the prior arts, and an object of the present invention is to provide a composition for forming a dielectric, which includes a resin and a semiconductive filler. At this time, the composition has an excellent dielectric constant and a relatively low dielectric loss.

Another object of the present invention is to provide a composition for forming a dielectric, which includes a resin and a semiconductive ferroelectric substance. In this regard, the composition has an excellent dielectric constant and a relatively low dielectric loss.

A further object of the present invention is to provide a capacitor, which is produced using the composition according to the present invention.

Yet another object of the present invention is to provide a PCB, which is provided with the capacitor according to the present invention.

The above objects can be accomplished by providing a composition for forming a dielectric, which includes 40-99 vol % of thermoplastic or thermosetting resin and 1-60 vol % of semiconductive filler, according to a first aspect of the present invention.

The above objects can be accomplished by providing a composition for forming a dielectric, which includes 40-95 vol % of thermoplastic or thermosetting resin and 5-60 vol % of semiconductive ferroelectric substance, according to a second aspect, of the present invention.

The above objects can be accomplished by providing a capacitor, which is produced using the composition for forming the dielectric of the present invention, according to a third aspect of the present invention.

The above objects can be accomplished by providing a PCB, which is provided with the capacitor of the present invention, according to a fourth aspect of the present invention.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
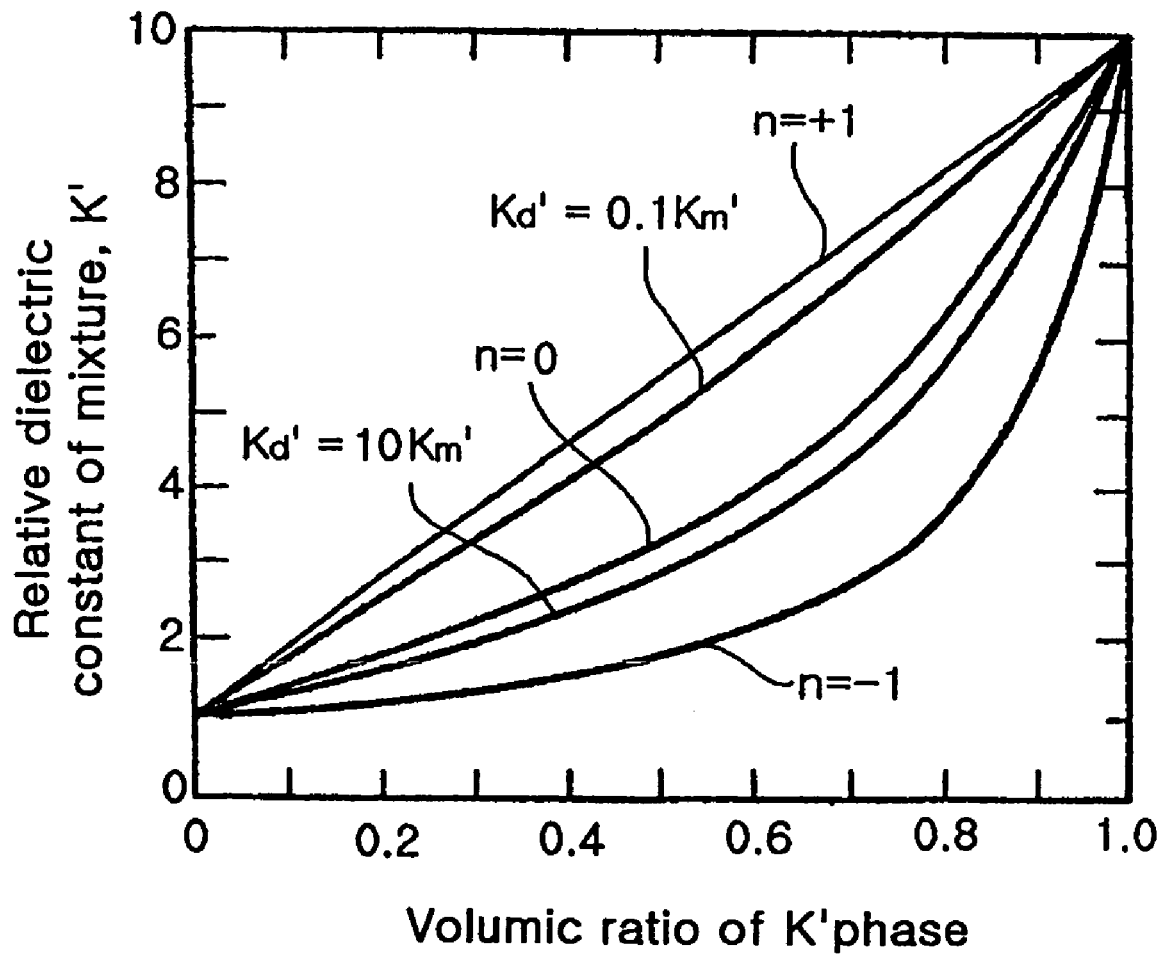
FIG. 1 is a graph illustrating a dielectric constant variation of a two-component mixture according to the Lichtenecker equation.

Hereinafter, a detailed description will be given of the present invention.

Conventionally, a resin is used in conjunction with a dielectric or a conductive material to produce a composite with a desired dielectric constant. However, the addition of the dielectric material does not contribute significantly to the improvement of the dielectric constant of the composite material, and the addition of the conductive material rather serves to increase the dielectric loss of the composite material. Additionally, the amount of the dielectric or conductive material is limited so as to prevent physical properties of the composite from being degraded.

The present invention provides a composition for forming a dielectric, which includes a resin, and a semiconductive material or a semiconductive ferroelectric substance. Such composition has an excellent dielectric constant and a relatively low dielectric loss.

According to the first embodiment of the present invention, instead of a conventional dielectric, a semiconductive filler is used with the resin to enable the composition to have dielectric properties.

According to the second embodiment of the present invention, the semiconductive filler may be used in conjunction with other kinds of fillers.

According to the third embodiment of the present invention, the semiconductive filler may include an insulator layer formed on a surface thereof to reduce the dielectric loss of the composition.

The resin, constituting the composition for forming the dielectric according to the present invention, may be exemplified by a thermosetting resin or a thermoplastic resin.

Non-limiting, illustrative examples of the thermosetting resin include an epoxy resin, a phenol resin, a polyimide resin, a melamine resin, a cyanate resin, a bismaleimide resin, a diamine additive polymer thereof, and a mixture thereof. Further, it is preferable that the thermosetting resin has excellent heat resistance. Taking the heat resistance, processability, and cost into consideration, the epoxy resin is most preferable as the thermosetting resin applied to the composition.

Illustrative, but non-limiting examples of the epoxy resin include hydrogenated compounds of epoxy compounds containing aromatic rings, such as a phenol novolac epoxy resin, a cresol novolac epoxy resin, a biphenyl epoxy resin, a biphenyl novolac epoxy resin, a tris-hydroxy phenyl methane epoxy resin, a tetra phenyl ethane epoxy resin, and a dicyclo pentadiene phenol epoxy resin, derivatives of aliphatic epoxy resin or cyclohexane oxide, a halogen-containing epoxy resin, such as a tetrabromo bisphenol A epoxy resin, and a mixture thereof.

Containing the resin and semiconductive filler, the composition for forming the dielectric may further contain a curing agent, a dispersing agent, and/or an antifoaming agent. Amounts and kinds of the curing agent, dispersing agent, and/or antifoaming agent are well known in the art, and may be properly selected by those skilled in the art.

In the case of using the epoxy resin, an epoxy resin curing agent may be used to produce the composition. At this time, non-limiting, illustrative examples of the epoxy resin curing agent include a phenol-based curing agent, such as phenol novolac, an amine-based curing agent, such as dicyan guanidine, dicyan diamide, diamino diphenyl methane, and diamino diphenyl sulfone, an acid anhydride curing agent, such as pyromelitic anhydride, trimelitic anhydride, and benzophenone tetra carboxylic acid, and a mixture thereof.

Additionally, non-limiting, illustrative examples of the thermoplastic resin include a phenoxy resin, a polyether sulfone resin, and a mixture thereof.

Furthermore, the composition for forming the dielectric contains the semiconductive filler, functioning to improve the dielectric constant, as well as the resin. The semiconductive filler may have an average particle size of 0.01 to 50 μm. When the average particle size of the semiconductive filler is less than 0.01 μm, the semiconductive filler is nonuniformly dispersed in the composition. On the other hand, when the average particle size of the semiconductive filler is more than 50 μm, the processability of the composition is reduced and voids are formed in the composition. The semiconductive filler may be exemplified by a non-stoichiometric compound, for example, ZnO having semiconductivity in an equilibrium state.

In this respect, the composition for forming the dielectric may contain 40-99 vol % of resin and 1-60 vol % of semiconductive filler.

When the content of the semiconductive filler in the composition is less than 1 vol %, an improvement of the dielectric constant of the composition is insufficient in comparison with the case of using a conventional filler with a relatively high dielectric constant, and the dielectric loss of the composition is relatively high. On the other hand, when the content of the semiconductive filler in the composition is more than 60 vol %, insulating properties of the composition are reduced and an impedance of the composition is increased because of the very high dielectric loss of the composition.

At this time, even though the dielectric constant of the composition, which contains the semiconductive filler, is increased, the dielectric loss of the composition may be undesirably increased. Accordingly, a ferroelectric insulator may be used in conjunction with the semiconductive filler, or an insulator layer may be formed on a surface of the semiconductive filler to prevent the dielectric loss of the composition from being increased.

In this respect, non-limiting, illustrative examples of the ferroelectric insulator filler, include $BaTiO_3$, $PbTiO_3$, a Pb-based ferroelectric insulator, such as PMN-PT, $SrTiO_3$, $CaTiO_3$, $MgTiO_3$, and a mixture thereof.

The composition for forming the dielectric may contain the ferroelectric insulator filler in an amount of maximally 59 vol %, preferably 10 to 59 vol % based on a total volume of the composition. As described above, the ferroelectric insulator filler is added to the composition so as to suppress the increase of the dielectric loss of the composition. However, even though the ferroelectric insulator filler is not added to the composition, the composition, containing the resin and semiconductive filler, has an excellent dielectric constant. When the content of the ferroelectric insulator filler in the composition is more than 59 vol %, the processability of the composition becomes poor.

With respect to this, the ferroelectric insulator filler is added to the composition such that a total content of the ferroelectric insulator filler and semiconductive filler is 1-60 wt % based on a weight of the composition.

Like in the case of the semiconductive filler, the ferroelectric insulator filler has an average particle size of 0.01-50 μm.

As well, the insulator layer may be formed on the surface of the semiconductive filler to suppress the increase of the dielectric loss of the composition caused by the semiconductive filler. In this regard, an insulating material may be coated on the surface of the semiconductive filler, or the semiconductive filler may be heat-treated to form the insulator layer on the surface of the semiconductive filler.

Non-limiting, illustrative examples of the insulating material include $BaTiO_3$ and Pb-based ferroelectric substance. They contribute to forming the insulating layer on the semiconductive filler without reducing the dielectric constant of the composition.

Furthermore, the insulating material may be coated on the surface of the semiconductive filler according to a liquid phase coating process, and the resulting semiconductive filler may be then heat-treated to form the insulator layer on the surface of the semiconductive filler. At this time, 70-95 vol %, preferably 80-90 vol % of insulating material is coated on the surface of the semiconductive filler based on a volume of the semiconductive filler. For example, when a content of the insulating material is less than 70 vol %, the liquid insulating material is insufficiently wetted and coated on the semiconductive filler. On the other hand, when the content of the insulating material is more than 95 vol %, crystallinity of the insulator layer, formed on the surface of the semiconductive filler, is poor.

Meanwhile, the liquid phase coating process may be classified into a sol-gel coating process and a spray process. The coated semiconductive filler is heat-treated at 700 to 1300° C. for 0.5 to 10 hours, and preferably for 1 to 5 hours under an oxidation atmosphere. When the coated semiconductive filler is heat-treated at a temperature lower than 700° C., the insulating material is insufficiently diffused into vacancies of the semiconductive filler. On the other hand, when the coated semiconductive filler is heat-treated at a temperature higher than 1300° C., the semiconductive filler becomes dense to alter physical properties of the semiconductive filler. As well, when the coated semiconductive filler is heat-treated for less than 0.5 hours, the insulator layer is undesirably formed on the surface of the semiconductive filler. On the other hand, when the coated semiconductive filler is heat-treated for more than 10 hours, the insulator layer becomes thick to reduce the dielectric constant of the composition.

As described above, the semiconductive filler may be heat-treated to be oxidized at the surface thereof to form the insulator layer on the semiconductive filler. At this time, the heat-treatment is conducted at 700 to 1300° C. for 0.5 to 10 hours, and preferably for 1 to 5 hour. When the heat-treatment is conducted at a temperature lower than 700° C., the insulating material is insufficiently diffused into the vacancies of the semiconductive filler, thus inhibiting the formation of an oxide layer on the surface of the semiconductive filler. On the other hand, when the heat-treatment is conducted at a temperature higher than 1300° C., the growth of particles constituting the semiconductive filler may occur, leading to the reduction of physical properties of the semiconductive filler. Furthermore, when the heat-treatment is conducted for less than 0.5 hours, the insulator layer is undesirably formed on the surface of the semiconductive filler. On the other hand, when the heat-treatment is conducted for more than 10 hours, the insulator layer becomes thick to reduce the dielectric constant of the composition. With respect to this, the oxide layer formed on the surface of the semiconductive filler by the heat-treatment acts as the insulator layer.

As well, the composition contains 40-95 vol % of resin and 5-60 vol % of semiconductive filler having the insulator layer formed on the surface thereof. When the semiconductive filler is oxidized or the insulator layer is formed on the surface of the semiconductive filler, the dielectric constant may be slightly reduced in comparison with the semiconductive filler, which is not oxidized and has no insulator layer on the surface thereof. Accordingly, when the semiconductive filler content of the composition is less than 5 vol %, the dielectric constant of the composition is undesirably low. Additionally, when the semiconductive filler content of the composition is more than 60 vol %, the processability of the composition is reduced, and thus, it is difficult to form a sheet using the composition.

In this regard, it is preferable that the semiconductive filler, including the insulator layer formed on the surface thereof, has an average particle size of 0.01 to 50 μm. When the semiconductive filler, including the insulator layer formed on the surface thereof, has an average particle size less than 0.01 μm, the semiconductive filler is nonuniformly dispersed in the composition. On the other hand, when the average particle size is more than 50 μm, the processability of the composition is reduced, and the voids may be formed in the composition during the production of the capacitor using the composition.

Moreover, the ferroelectric insulator filler may be added in conjunction with the resin and the semiconductive filler, including the insulator layer, to the composition for forming the dielectric.

In case that the composition includes the resin and semiconductive filler, the dielectric formed using the composition has a dielectric constant of 20 or more, preferably 50 or more, and a dielectric loss of 5 or less, preferably 1 or less. Additionally, the composition for forming the dielectric according to the present invention is usefully applied to produce an embedded capacitor with the relatively high dielectric constant and a PCB provided with the embedded capacitor.

Further, the present invention provides the composition for forming the dielectric, which includes the resin and semiconductive ferroelectric substance. In the present invention, the ferroelectric substance is used as the dielectric material treated so as to have semiconductivity.

The resin of the composition, containing the resin and semiconductive ferroelectric substance, may be the same as that of the composition, containing the resin and semiconductive filler. Additionally, the composition may further include the curing agent, dispersing agent, and/or antifoaming agent, as desired.

In this regard, the ferroelectric substance is heat-treated, or a predetermined additive is added onto a surface of the ferroelectric substance and then the resulting ferroelectric substance is heat-treated, thereby the ferroelectric substance gaining semiconductivity. The use of the semiconductive ferroelectric substance increases the dielectric constant of the composition, unlike the case of using a conventional ferroelectric substance. At this time, the dielectric loss of the composition is not increased or is rather reduced.

The ferroelectric substance according to the present invention is exemplified by $BaTiO_3$, $PbTiO_3$, the Pb-based ferroelectric substance, such as PMN-PT, $SrTiO_3$, $CaTiO_3$, $MgTiO_3$, or a mixture thereof.

In other words, the ferroelectric substance is heat-treated at 800 to 1300° C., preferably 1000 to 1300° C. for 0.5 to 10 hours under an oxidation, a reduction, or a vacuum atmosphere to increase vacancies filled with oxygen (oxygen vacancy) in the ferroelectric substance, thereby gaining semiconductivity.

With respect to this, when the heat-treatment is conducted at a temperature less than 800° C. or for a time less than 0.5 hours, energy input is insufficient to form the oxygen vacancies in the ferroelectric substance. On the other hand, when the heat-treatment is conducted at a temperature more than 1300° C. or for a time more than 10 hours, the growth of particles of the ferroelectric substance constituting the composition may occur after the oxygen vacancies are formed in the ferroelectric substance, thus reducing the dielectric constant of the composition.

As described above, the heat-treatment may be conducted under an oxidation, reduction, and vacuum atmosphere.

In detail, in the case of the oxidation atmosphere, the heat-treatment is conducted under atmospheric air or oxygen gas while an oxygen partial pressure is controlled using $N_2$ gas, $H_2$ gas, or a mixed gas of $N_2$ and $H_2$. At this time, oxygen is diffused from an inside to an outside of the ferroelectric substance, thereby forming the oxygen vacancies in the ferroelectric substance.

In the case of the reduction atmosphere, the heat-treatment is conducted while the oxygen partial pressure is controlled using $N_2$ gas, $H_2$ gas, or a mixed gas of $N_2$ and $H_2$. At this time, because the heat-treatment is conducted at 800 to 1300° C., the oxygen vacancies filled with oxygen are formed in the ferroelectric substance due to the relatively low oxygen partial pressure, and the oxygen vacancies contribute to semiconductivity of the ferroelectric substance.

As for the vacuum atmosphere, the number of the oxygen vacancies is controlled by the degree of vacuum, and the heat-treatment is conducted under the vacuum atmosphere to increase the oxygen vacancies, thereby the ferroelectric substance gains semiconductivity.

Meanwhile, the ferroelectric substance may be heat-treated at 800 to 1300° C., preferably 1000 to 1300° C. for 0.5 to 10 hours under the oxidation, reduction, or vacuum atmosphere after the additive is added to the ferroelectric substance, thereby gaining semiconductivity.

In this respect, the additive (hereinafter, referred to as "dopant") added to the ferroelectric substance may be at least one selected from the group consisting of 2+, 3+, and 5+ oxides of Mn, Mg, Sr, Ca, Y, and Nb, and an oxide of lanthanide. At this time, the lanthanide is selected from the group consisting of Ce, Dy, Ho, Yb, and Nd.

The dopant is added to the ferroelectric substance in an amount of 0.01 to 5 mol %, preferably 1 to 2 mol %, based on 1 mole of the ferroelectric substance. When the dopant content in the ferroelectric substance is less than 0.01 mol %, the number of the oxygen vacancies is small, thus insufficiently increasing the dielectric constant. On the other hand, when the dopant content in the ferroelectric substance is more than 5 mol %, the ferroelectric substance has two different phases, and thus, the dielectric constant of the ferroelectric substance is reduced. The heat-treatment after the dopant is added to the ferroelectric substance is conducted according to the same procedure as in the case of heat-treating the ferroelectric substance without using the dopant.

The composition for forming dielectric according to the present invention may include 40-95 vol % of resin and 5-60 vol % of semiconductive ferroelectric substance. Preferably, the composition includes 50 to 70 vol % of resin and 30-50 vol % of semiconductive ferroelectric substance. When the content of the semiconductive ferroelectric substance is less than 5 vol %, the dielectric constant of the composition is relatively small. On the other hand, when the content of the semiconductive ferroelectric substance is more than 60 vol %, the processability of the composition is reduced.

In the case of the composition including the resin and semiconductive ferroelectric substance, a dielectric layer formed using the composition has a dielectric constant of 20 or more, preferably 50 or more, and a dielectric loss of 1 or less, preferably 0.1 or less and more preferably 0.05 or less. Particularly, the composition may be usefully applied to produce an embedded capacitor with relatively high dielectric constant, and to produce a PCB including the embedded capacitor.

As for the semiconductive ferroelectric substance which is produced by heat-treating the ferroelectric substance, or heat-treating the ferroelectric substance after the dopant is added to the ferroelectric substance according to the present invention, the semiconductive ferroelectric substance of the present invention has a dielectric constant two times higher than the conventional ferroelectric substance, and a lower dielectric loss than the conventional ferroelectric substance. Hence, the semiconductive ferroelectric substance of the present invention may be useful to produce an embedded dielectric film with excellent dielectric properties.

For example, when a material of an embedded capacitor is produced using the composition, including the resin and semiconductive ferroelectric substance, according to the present invention, the material has a relatively high dielectric constant of 50 (1 kHz) or more.

Furthermore, in case that an insulating film is produced using the composition, including the semiconductive ferroelectric substance, of the present invention, it is possible to produce an excellent insulating film with a dielectric constant of 50 or more and a dielectric loss of 0.05 or less.

Having generally described this invention, a further understanding can be obtained by reference to examples and comparative examples, which are provided herein for the purposes of illustration only and are not intended to be limiting unless otherwise specified.

EXAMPLE 1

A dielectric slurry was produced using a ferroelectric substance ($BaTiO_3$), metal powder (Cu, Ni), or a semiconductive filler (ZnO) as filler, and bisphenol A as described in the following Table 1, and a capacitor as a cured composite with relatively high dielectric constant, was produced using the dielectric slurry. Dielectric properties of the capacitor, depending on an additive, were evaluated.

The filler was treated according to a predetermined procedure as will be described later, pulverized into particles with an average particle size of about 0.2 μm, and mixed in an amount of 20 vol % with bisphenol A, which was already mixed with a curing agent and a dispersing agent in acetone, to produce the slurry. In this respect, dicyan guanidine was added as the curing agent to the slurry in such a way that a weight ratio of bisphenol A to the curing agent was 62:8.5, and 0.01 vol % of phosphate ester was added as the dispersing agent to the slurry, based on a volume of the slurry.

The slurry was coated in a thickness of 100 μm on a copper plate with a thickness of 35 μm, and cured at 170° C. for 20 min to produce a dielectric layer. An electrode was formed on the dielectric layer to produce a capacitor. A dielectric constant and a dielectric loss of the capacitor were measured at a frequency of 1 kHz using an impedance analyzer (HP4294A) on the basis of IPC-TM-650, and the results are described in the following Table 1.

Meanwhile, fillers used in example 1 are as follows:

(1) $BaTiO_3$ (2) Semiconductive $BaTiO_3$, which was produced in such a way that $BaTiO_3$ was heat treated at 1100° C. for 1 hour under a vacuum atmosphere by increasing the temperature at a rate of 5° C./min up to 1100° C.

(3) Semiconductive $BaTiO_3$, which was produced in such a way that after 2 mol % of CaO liquid was added to $BaTiO_3$, CaO-doped $BaTiO_3$ was heat treated at 1100° C. for 1 hour under a vacuum atmosphere by increasing the temperature at a rate of 5° C./min up to 1100° C.

(4) Semiconductive $BaTiO_3$, which was produced in such a way that after 2 mol % of CaO solid was added to $BaTiO_3$, CaO-doped $BaTiO_3$ was heat treated at 1100° C. for 1 hour under the oxidation atmosphere by increasing the temperature at a rate of 5° C./min up to 1100° C. and then heat treated at 1100° C. for 1 hour under a vacuum atmosphere by increasing the temperature at a rate of 5° C./min up to 1100° C.

(5) Semiconductive $BaTiO_3$, which was produced in such a way that after 2 mol % of CaO liquid was added to $BaTiO_3$, CaO-doped $BaTiO_3$ was calcined at 790° C. for 1 hour under an oxidation atmosphere and then heat treaed heated at 1100° C. for 1 hour under a vacuum atmosphere by increasing the temperature at a rate of 5° C./min up to 1100° C.

(6) Semiconductive $BaTiO_3$, which was produced in such a way that after 2 mol % of CaO liquid was added to $BaTiO_3$, CaO-doped $BaTiO_3$ was heat treated at 1100° C. for 1 hour under an oxidation vacuum atmosphere by increasing the temperature at a rate of 5° C./min up to 1100° C. and then heat treated at 1100° C. for 1 hour under a vacuum atmosphere by increasing the temperature at a rate of 5° C./min up to 1100° C.

(7) Cu powder (8) Cu powder, which was produced in such a way that after 90 vol % of BT was added to the Cu powder based on a volume of the Cu powder, the BT-doped Cu powder was heat treated at 1100° C. for 1 hour under an oxidation atmosphere by increasing the temperature at a rate of 5° C./min up to 1100° C.

(9) Ni powder, which was produced in such a way that after 90 vol % of BT was added to the Ni powder based on a volume of the Ni powder, the BT-doped Ni powder was heat treated at 1100° C. for 1 hour under an oxidation vacuum atmosphere by increasing the temperature at a rate of 5° C./min up to 1100° C.

(10) 2.5 vol % of ZnO and 17.5 vol % of BCT

(11) 5.0 vol % of ZnO and 15.0 vol % of BCT

(12) 7.5 vol % of ZnO and 12.5 vol % of BCT

(13) 10.0 vol % of ZnO and 10.0 vol % of BCT

(14) ZnO powder, including an oxide insulator layer formed on a surface thereof, which was produced in such a way that the ZnO powder was heat treated at 1100° C. for 1 hour under an oxidation atmosphere by increasing the temperature at a rate of 5° C./min up to 1100° C.

TABLE 1

| | | Heat-treatment (1100° C.) | | | Additive | | | Dielectric properties | |
|---|---|---|---|---|---|---|---|---|---|
| | | Vacuum | Oxidation | Reduction | CaO | BCT ① | BT ② | Dielectric constant, K | Dielectric loss, Df |
| (1) | $BaTiO_3$ | | | | | | | 13 | 0.05 |
| (2) | $BaTiO_3$ | 0 | | | | | | 18.5 | 0.04 |
| (3) | $BaTiO_3$ | 0 | | | 0 | | | 13.4 | 0.04 |
| (4) | $BaTiO_3$ | 0 | 0 | | 0 | | | 17.6 | 0.04 |
| (5) | $BaTiO_3$ | 0 | 0 | | 0 | | | 18.4 | 0.04 |
| (6) | $BaTiO_3$ | 0 | 0 | | 0 | | | 19.1 | 0.04 |
| (7) | Cu | | | | | | | Short | — |
| (8) | Cu | | 0 | | | | 0 | 75 | 2.08 |
| (9) | Ni | | 0 | | | | 0 | 20 | 0.17 |
| (10) | ZnO | | | | | 0 | | 54.37 | 0.51 |
| (11) | ZnO | | | | | 0 | | 143.30 | 3.17 |
| (12) | ZnO | | | | | 0 | | 182.19 | 1.28 |

TABLE 1-continued

| | Heat-treatment (1100° C.) | | | Additive | | | Dielectric properties | |
|---|---|---|---|---|---|---|---|---|
| | | | | | | | Dielectric | |
| | | | | | BCT | BT | constant, | Dielectric |
| | Vacuum | Oxidation | Reduction | CaO | ① | ② | K | loss, Df |
| (13) ZnO | | | | | 0 | | 144.75 | 1.45 |
| (14) ZnO | | 0 | | | | | 14 | 0.2 |

(① BCT is $Ba_{(1-x)}Ca_xTiO_3$ (x = 0.02), and ② BT is $BaTiO_3$)

The fillers (1), (7) to (9) included additives, which were not treated according to a treating process of the present invention. The filler (1) had a poor dielectric constant. In the case of the filler (7), a short occurred, and the filler (8) had a relatively large dielectric loss. Additionally, the filler (9) had a relatively low dielectric constant in consideration of its dielectric loss. Therefore, the above semiconductive fillers (1), (7) to (9) had poor physical properties, and thus, they are not considered suitable as a dielectric.

However, the capacitor, which was produced with the use of the slurries including the additives treated according to the present invention, had excellent dielectric properties, such as relatively high dielectric constant and relatively low dielectric loss. Additionally, the filler (11) had relatively high dielectric loss but had drastically high dielectric constant in comparison with the dielectric loss, thus the filler (11) had excellent dielectric properties.

Further, the dielectric constant of the dielectric, produced using the composition, containing 40 vol % of filler, according to the present invention, was two times higher than that of the dielectric, produced using the dielectric slurry containing 20 vol % of additive of example 1.

EXAMPLE 2

The procedure of example 1 was repeated to produce a dielectric slurry and a capacitor except that each semiconductive ferroelectric substances A and B was pulverized with an average particle size of about 1 μm and each pulverized substance A and B was mixed with 44 vol % of resin. A dielectric constant and a dielectric loss of the capacitor were measured, and the results are described in the following Table 2.

After 2 mol % of CaO was added based on 1 mole of a ferroelectric substance, $BaTiO_3$, to the ferroelectric substance, the resulting ferroelectric substance was heat treated at 1100° C. for 1 hour under a vacuum atmosphere by increasing the temperature at a rate of 5° C./min up to 1100° C. to accomplish $BaTiO_3$ powder used as the semiconductive ferroelectric substance A. As well, $BaTiO_3$ was heat treated at 1100° C. for 1 hour under a vacuum atmosphere by increasing the temperature at a rate of 5° C./min up to 1100° C. to accomplish $BaTiO_3$ powder used as the semiconductive ferroelectric substance B.

TABLE 2

| | Dielectric constant, K | Dielectric loss, Df |
|---|---|---|
| A | 57 | 0.04 |
| B | 52 | 0.05 |

When capacitors included 44 vol % of semiconductive ferroelectric substances A and B, the capacitors had excellent dielectric constants of 50 or more and relatively low dielectric loss.

As described above, a dielectric, which is produced using a composition including a semiconductive filler or semiconductive ferroelectric substance in an amount of 40 vol % or more according to the present invention, is advantageous in that its dielectric constant is relatively high and its dielectric loss is relatively low. In this regard, the dielectric is usefully applied to produce an embedded capacitor with an excellent dielectric constant, and a PCB provided with the embedded capacitor.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A composition for forming a dielectric, comprising:
   40 to 99 vol % of thermoplastic or thermosetting resin;
   1 to 60 vol % of semiconductive filler, and
   greater than zero to 59 vol % of ferroelectric insulator substance on a total volume of the composition, the ferroelectric insulator substance being selected from the group consisting of $BaTiO_3$, $PbTiO_3$, PMN-PT, $SrTiO_3$, $CaTiO_3$, and $MgTiO_3$, and wherein
   the semiconductive filler includes an insulator layer formed on a surface thereof.

2. The composition as set forth in claim 1, wherein the semiconductive filler is a non-stoichiometric compound.

3. The composition as set forth in claim 2, wherein the semiconductive filler is ZnO.

4. The composition as set forth in claim 1, wherein the thermosetting resin is selected from the group consisting of an epoxy resin, a phenol resin, a polyimide resin, a melamine resin, a cyanate resin, a bismaleimide resin, a diamine additive polymer thereof, and a mixture thereof.

5. The composition as set forth in claim 1, wherein the thermoplastic resin is selected from the group consisting of a phenoxy resin, a polyether sulfone resin, and a mixture thereof.

6. The composition as set forth in claim 1, wherein the semiconductive filler has an average particle size of 0.01 to 50 μm.

7. The composition as set forth in claim 1, wherein the semiconductive filler is heat-treated at 700 to 1300° C. for 0.5 to 10 hours under an oxidation atmosphere to form the insulator layer on the surface thereof.

8. The composition as set forth in claim 1, wherein the semiconductive filler is heat-treated at 700 to 1300° C. for 0.5 to 10 hours under an oxidation atmosphere after $BaTiO_3$ or Pb-based ferroelectric substance is coated on the semiconductive filler according to a liquid phase coating process, thereby forming the insulator layer on the surface thereof.

9. The composition as set forth in claim 1, comprising 40 to 95 vol % of resin, and 5 to 60 vol % of semiconductive filler including the insulator layer formed on the surface thereof.

10. A capacitor, produced using the composition for forming the dielectric according to claim 1.

11. A printed circuit board, comprising the capacitor according to claim 10.

* * * * *